United States Patent [19]

Naumann et al.

[11] Patent Number: 4,740,264
[45] Date of Patent: Apr. 26, 1988

[54] LIQUID ENCAPSULATED FLOAT ZONE PROCESS AND APPARATUS

[75] Inventors: Robert J. Naumann; Donald O. Frazier; Sandor L. Lehoczky; Marcus Vlasse, all of Huntsville; Barbara R. Facemire, Scottsboro, all of Ala.

[73] Assignee: The United States of America as represented by the Administrator of the National Aeronautics and Space Administration, Washington, D.C.

[21] Appl. No.: 924,399

[22] Filed: Oct. 29, 1986

[51] Int. Cl.⁴ .............................................. C30B 27/02
[52] U.S. Cl. .............................. 156/620.76; 156/607; 156/DIG. 70; 156/DIG. 72; 156/DIG. 82; 156/DIG. 84; 156/DIG. 89; 156/DIG. 92; 156/DIG. 93; 156/DIG. 98; 156/DIG. 62
[58] Field of Search ............... 156/617 R, 617 A, 607, 156/616 R, 616 A, 620, DIG. 70, DIG. 72, DIG. 82, DIG. 84, DIG. 88, DIG. 89, DIG. 92, DIG. 93, DIG. 98, DIG. 62

[56] References Cited

U.S. PATENT DOCUMENTS

| | | | |
|---|---|---|---|
| 4,585,511 | 4/1986 | Bult et al. | 156/607 |
| 4,645,560 | 2/1987 | Matsumoto et al. | 156/607 |
| 4,654,110 | 3/1987 | Morrison | 156/617 H |

FOREIGN PATENT DOCUMENTS 2125706  3/1984  United Kingdom .............. 156/607

Primary Examiner—Asok Pal
Attorney, Agent, or Firm—William J. Sheehan; John R. Manning; Leon D. Wofford, Jr.

[57] ABSTRACT

Process and apparatus for growing crystals using float zone techniques. A rod (34) of crystalline materials is disposed in a cylindrical container (36), with a space being left between the rod and container walls. The space is filled with an encapsulant (72), selected to have a slightly lower melting point than the crystalline material. The rod is secured to a container end cap (38) at one end and to a shaft (60) at its other end. A piston (64) slides over the rod and provides pressure to prevent loss of volatile components upon melting of the rod. Prior to melting the rod the container is first heated to melt the encapsulant, with any off-gas from this step being vented to a cavity behind the piston. The piston moves slightly forward owing to volume change upon melting of the encapsulant, and the vent passageway (74) is closed. The container is then moved longitudinally through a heated zone (32) to progressively melt sections of the rod as in conventional float zone processes.

6 Claims, 2 Drawing Sheets

LIQUID ENCAPSULATED FLOAT ZONE PROCESS AND APPARATUS

ORIGIN OF THE INVENTION

The invention described herein was made by employees of the U.S. Government and may be manufactured and used by or for the Government for governmental purposes without the payment of any royalties thereon or therefor.

TECHNICAL FIELD

This invention relates generally to processes and apparatus for growing crystals, and more particularly to float-zone processes.

BACKGROUND OF THE INVENTION

Development of better bulk growth techniques is an urgent requirement in meeting the demand for better crystal materials with direct band gaps, higher electron mobilities and less susceptibility to radiation damage. In particular, compound systems such as III–V and II–V and various alloy systems offer attractive properties for a variety of applications requiring such characteristics.

The growth of high quality single crystalline Si in bulk quantities has been possible for a number of years. This, however, is not the case for the III–V and II–VI compound or alloy-type systems. Growth in these systems is complicated by the presence of more than one component which is often volatile and whose composition must be precisely controlled. Alloy-type systems are even more difficult because of macrosegregation resulting from the large segregation coefficients, density differences between constituents, and buoyancy-driven convective flows driven by thermal or solutal gradients. Such flows can redistribute solute, transport contaminants from the crucible, and produce fluctuations in the growth environment which can lead to various defect formation. Dislocations can be produced by unfavorable interface shape (i.e., concave to the melt), thermal strains, and mechanical stress from confining vessels. The most widely used techniques for bulk growth of compound semiconductors have been horizontal Bridgman using an open load in a pressurized vessel, liquid encapsulated Czochralski, and vertical Bridgman-Stockbarger in a closed ampoule. For GaAs, the horizontal Bridgman technique generally produces material with fewer dislocations, presumably because of the open boat design which allows the material some freedom to expand on freezing. However, if a dopant is added, the uncontrolled convection inherent in the process causes the dopant concentration to vary continuously along the length of the sample.

Single crystalline Si has been effectively grown in bulk by means of float-zone processes. In this type of process a polycrystalline rod supported at each end is passed through a heated region so as to form a molten zone that progresses along the rod. The process is containerless and it depends on surface tension and Lorenz forces from the induction heating coil for support of the molten zone.

Application of float-zone processes to compound and alloy systems, however, is beset with difficulties owing to differences between the properties of Si and these materials. Limitations to extending Si float-zone growth to other materials are as follows:

1. Si has an unusually large surface tension (ten times that of $H_2O$) which helps support large molten zones. 2. Molten Si is a good electrical conductor which allows RF induction heating which also provides additional Lorentz forces to help support the molten zone. 3. Even though it is possible to eliminate dislocations in float zone Si, there are severe growth rate fluctuations and thus compositional striations caused by the heating asymmetry inherent in the RF work coil and by uncontrolled convection driven by buoyant as well as surface tension forces. In fact a recent space experiment indicated that surface tension-driven convection may be the dominant cause of such striations. The growth rate fluctuations are not particularly serious in an intrinsic elemental semiconductor such as Si, but could produce serious inhomogeneities and defects in extrinsic, alloy type, or compound semiconductors. Another difficulty with conventional float-zone growth of multicomponent systems is the control of stoichiometry since the the more volatile component will tend to evaporate at the free surface. Liquid phase encapsulants cannot generally be used because of gravity drainage. Maintaining an over-pressure of the volatile component may not be possible because of the temperature variations associated with the process since the maximum pressure of a particular component that can be obtained is the vapor pressure of the component in question at the temperature of the coldest region in the pressure vessel. Finally, the float zone process cannot be successfully applied to many materials on Earth because of their low surface tension. This is especially true for poor conductors because Lorentz forces cannot be used to help support the molten zone.

It is therefore an object of this invention to provide a float-zone process for growing crystals of compound and alloy systems in which dislocations in the grown crystal are significantly reduced or eliminated.

Another object is to provide a float-zone process wherein stoichiometry is maintained and loss of volatile components from compound systems is prevented.

Yet another object is to provide a float-zone process wherein buoyant support for the molten zone is provided.

Another object is to provide a float-zone process wherein materials having a low surface tension may be accommodated.

Another object is to provide a float-zone process for use in the microgravity environment of space.

A further object is to provide apparatus for carrying out a process meeting the above objects.

SUMMARY OF THE INVENTION

In accordance with this invention a quasi-containerless float-zone process is provided by disposing an encapsulant between the rod of material being treated and a surrounding ampoule or container. The encapsulant, selected to have a lower melting point than the material of the rod, melts to form a viscous liquid medium in which the process is carried out. This approach prevents the loss of volatile components and enables stoichiometry to be maintained in compound systems such as GaAs, CdTe and HgCdTe, while allowing unconfined growth to reduce or eliminate mechanical strains in the grown crystal. Thus the invention enables growth of low dislocation-density crystals with precisely controlled stoichiometry from materials that are not amenable to conventional float-zone crystal growth. In addition, this method offers far better control of surface tension-driven convection (Marangoni flows) than is possible with convention float zone growth methods and can be used to grow larger crystals, especially in systems that have relatively low surface tension. The method can be dramatically enhanced by operating in the micro-gravity environment of an orbiting spacecraft in which buoyancy-driven convection can also be controlled, and hydrostatic pressure no longer restricts the size of the crystal that can be grown.

Apparatus features of the invention include, in addition to features normally employed in conventional float-zone systems, an ampoule for containing the rod and surrounding encapsulant and a spring-loaded piston fitted at the top of the ampoule to allow for thermal expansion/contraction and to maintain pressure greater than the vapor pressure of the most volatile component at the highest temperature required. The sample rod is fixed to a control rod which slides through an opening in the piston. This enables independent control of the rate at which feed material enters the molten region, which rate controls the diameter of the growing crystal. A passageway is provided in the shaft to allow gases that are released upon initial melting to be vented to the cavity behind the piston.

DESCRIPTION OF A PREFERRED EMBODIMENT

Figure 1:
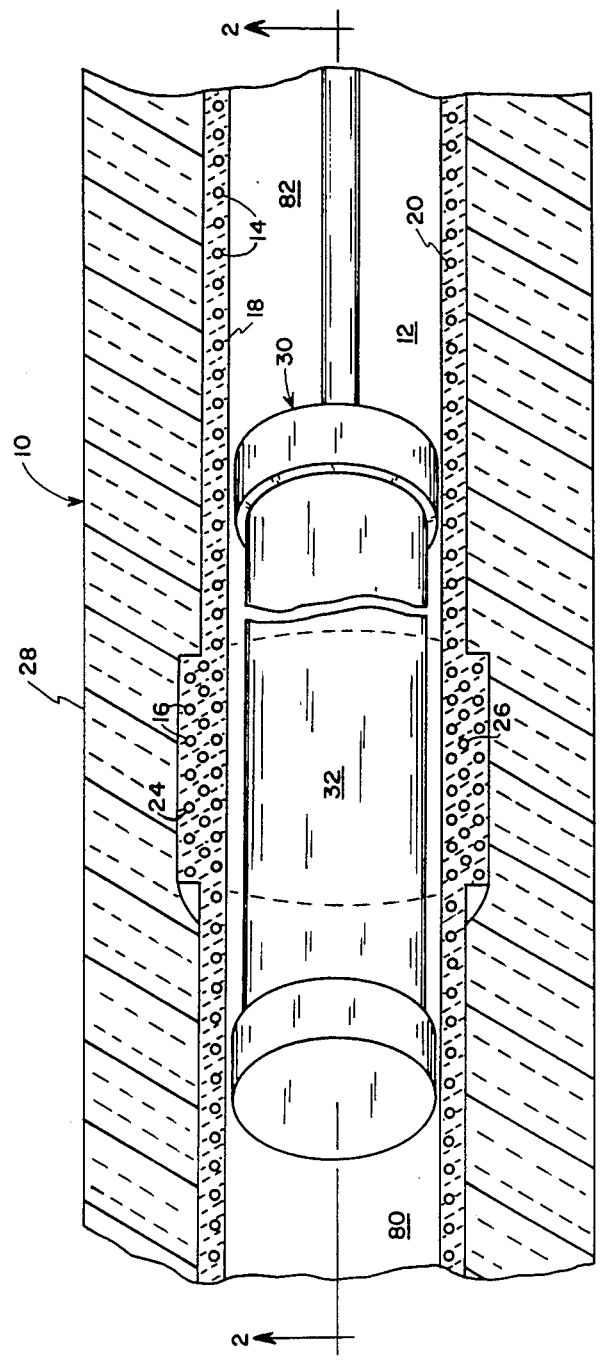
FIG. 1 is an elevational view, partly in section, illustrating a crystal growth apparatus.

FIG. 1 generally illustrates apparatus for growing crystals according to the invention. Basically it contemplates a furnace 10 which has a cylindrical chamber 12. Heat is provided by two sets 14 and 16 of resistance heating wires spiral wound in a wall 18 of the furnace which surrounds chamber 12. Set 14 consists of a single strand of resistance heating wires 20 which generally extend the length of the furnace, and a second set 16 consists of two rows 24 and 26 of resistance heating wires which cover only a limited region as shown and provides enhanced heat for the limited region. An outer layer 28 of insulating material confines heat to chamber 12. Crystalline support structure 30 is tubular and is adapted to be moved in, through, and out of chamber 12. FIG. 1 also illustrates a heat zone 32 that is determined by the position of set 16 of resistance wires 24 and 26 with respect to the support structure. Thus, heat zone 32 remains stationary as support structure 30 is moved through it.

Figure 2:
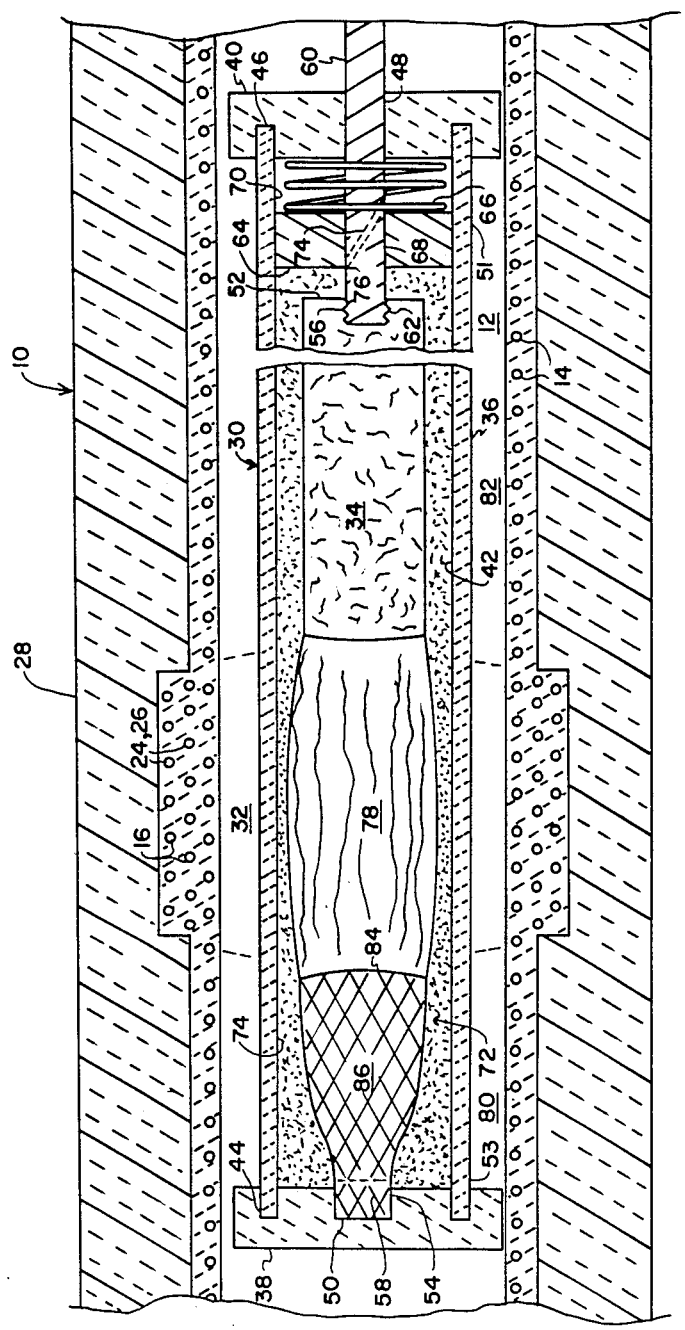
FIG. 2 is a sectional elevational view taken along line 2—2 of FIG. 1.

Referring now to FIG. 2, it illustrates in detail crystalline support structure 30 and the arrangement of the crystalline material, in this case, a rod 34 of crystalline material, within structure 30. Support structure 30 basically employs a tubular member 36 and end caps 38 and 40 which form an enclosure 42. End caps 38 and 40 have recesses 44 and 46 into which ends 51 and 53 of tubular member 36 fit. End cap 40 has a central opening 48, and end cap 38 has a centrally positioned recess 50 openable into enclosure 42 of support structure 30. Tubular member 36 and end caps 38 and 40 are made of a refractory material, which maintains their integrity during the application of heat from sets of resistance wires 14 and 16.

A rod 34 of crystalline material to be processed or grown is conventionally constructed with a uniform diameter as illustrated by end region 52 of rod 34, as shown in FIG. 2. This would, of course, be its initial shape before the processing illustrated by FIG. 2. It would then include a region 54 of reduced diameter sized to fit within recess 50. There would be a threaded cavity 56 at the opposite end of rod 34. Rod 34 is placed in support structure 30 with its end 54 in place in recess 50, and there would be in end region 54 of rod 34 a seed crystal 58. The opposite end 51 of support structure 30 would be initially left open with cap 40 removed and end region 52 of rod 34 exposed. Control shaft 60, constructed of a high temperature metal, and which has a threaded end 62, would then be screwed into threaded opening 56 of rod 34. After this, an encapsulant 72, for example, initially in powdered form, would be pressed into the annular region between rod 34 and tube 36 of structure 30. A piston 64 having an axial opening 68 would then be inserted over shaft 60 and would be compressed against the encapsulating material by spring 66, tension being maintained on spring 66 by then fixing in place end cap 40. Shaft 60 has a diagonal passageway, 74 which, when piston 64 is in its starting position (not shown), provides a vent communicating the space in front of the piston with the cavity behind it. Encapsulant 72 is chosen to be a material which provides no contamination or doping to rod 34 and, for example, with rod 34 being of gallium arsenide (GaAs), the encapsulant might be of boron oxide ($B_2O_3$). As a further constraint, encapsulant 72 is selected to be very viscous when in a molten state. Further, encapsulant 72 is chosen so as to be completely immiscible with rod 34 when the two are in a molten state and the encapsulant has wetting properties which wet interior wall 74 of tube 36 in preference to rod 34.

To examine operation of applicants' system, electrical power is applied to set 14 of resistance wire 20, with the result that supporting structure 30, encapsulant 72, and rod 34 are heated. This effects melting of encapsulant 72 and permits piston 64 to exert pressure which is distributed to encapsulant 72. This pressure, which is provided by spring 66, is typically of a value of from 10 to 100 PSI. This pressure is selected to be higher than the vapor pressure of the most volatile component in rod 34. Gas is liberated by the melting of encapsulant 72 and is allowed to escape via vent 74 along with some encapsulant 72, this being enabled until piston 64 is moved to a point 76, at which vent 74 is obstructed by the piston and is thereby closed, and by which point there will have occurred necessary venting of gases.

Next, with high heat intensity set 16 of resistance wire energized, structure 30 is moved to a position (not shown) such that the area of rod 34 adjacent to the seed crystal 58 is within the combined heating sets 14 and 16 of resistance wires. As a result, a portion of the seed crystal 58 and adjacent rod 34 melt. After this initial melting is accomplished, structure 30 is slowly moved (by means not shown) in chamber 12 to the position illustrated in FIG. 2, wherein there occurs a molten zone 78. With continued movement of structure 30, this molten zone is moved the length of rod 34 and thus toward its opposite end 52. Several passes may be made in this manner for purification purposes, which tends to sweep impurities to the ends of the crystal thus formed from rod 34, leaving a pure region of crystalline material in the center region of rod 34. On the final pass, shaft 60 may be moved outward to provide a constriction or neck in the molten zone 78 of rod 34 to help grow out any dislocations so that the remaining crystal will grow dislocation-free. This is similar to the practice used to grow dislocation-free silicon which assures that a crystalline lattice will grow in a desired orientation. Additionally, the temperature of the cooler regions 80 and 82 may be adjusted relative to the region 32 of greater heat to form a temperature gradient in rod 34, causing a preferred convex interface 84 to form between molten zone 78 and growing crystal 86, which further aids in reducing dislocations. This would be effected by power adjustment to sets 14 and 16 of the resistance wires. For distributing dopants which may be incorporated in rod 34 during its initial construction, a single pass of structure 30 through heat zone 32 may be made, which sweeps a molten zone through rod 34 and effects a uniform distribution of dopants throughout the growing crystal.

Alternately, it is to be appreciated that instead of the employment of the fixed set 16 of resistance or heat windings 24 and 26 of furnace 10, these windings may be constructed as a movable collar (not shown) which would be moved along the length of furnace 10, forming a molten zone along the length of rod 34.

Wall temperatures of the furnace may be adjusted relative to the heat zone to control the length of the molten region in the rod, the shape of the interface at the growing crystal and the axial gradient in the growing crystal. For lightly doped or intrinsic elemental or compound systems, large axial thermal gradients are not required to stabilize the interface. Use of this hot wall technique to lower the axial gradient conserves electrical power (which is very important in space applications), reduces defects caused by thermal strain and reduces surface tension-driven convection.

Although the use of a liquid encapsulant suppresses surface-tension driven convection, the interfacial tension between the sample melt and the encapsulant may vary with temperature, producing some surface tension-driven flows. Such flows can be further minimized by using relatively low axial thermal gradients and by using a relatively thin layer of encapsulant between the molten sample and the container walls. The walls impose a no-slip boundary condition on the encapsulant, especially for high-viscosity encapsulants such as $B_2O_3$. Magnetic fields can also be used for further suppression of convective flows.

The liquid encapsulant provides an easily deformable medium in which the sample is free to expand or contract without being strained. Since many semiconductor systems expand upon freezing, container-induced strains are thought to be an important factor in defect formation. In addition the encapsulant provides additional buoyancy support for the molten zone. Even through it may not be possible to always find a close density match, the additional support will allow larger zones to be formed in earth's gravity. Larger zones mean increased sample size and better control of thermal profiles, especially near the solidification interface. Float zone processing of low-surface-tension materials such as many organic and polymeric systems may also become practical.

While a preferred embodiment of the invention has been described using specific terms, such description is for illustrative purposes only, and it is to be understood that changes and variations may be made without departing from the spirit or scope of the following claims.

What is claimed is:

1. The process of growing crystals which comprises:
   placing an elongated rod of crystalline material having a seed crystal disposed in contact with one end thereof into a closed container having walls larger than the rod so as to provide an open space therebetween;
   filling said open space with an encapsulant having a slightly lower melting point than said crystalline material;
   heating the container to temperature such as to melt the encapsulant, but not the crystalline material, said rod becoming covered with molten encapsulant;
   venting off-gas produced upon said heating step away from the encapsulant covered rod;
   pressurizing the molten encapsulant covering the rod so as to terminate said venting after a releasing said off-gas and prevent loss of volatile components upon melting of the rod;
   passing the container through a heated zone transverse to the rod such that a molten region forms at the seeded end of the rod and progresses longitudinally through the rod as the container moves through said heated zone, the rod re-solidifying as it moves out of the heated zone.

2. The process as defined in claim 1 wherein said crystalline material is GaAs and said encapsulant is $B_2O_3$.

3. The process as defined in claim 1 wherein said pressurizing is obtained by forcing against said molten encapsulant a piston in sliding contact with said container walls.

4. The process is defined in claim 3 wherein a pressure of 10 to 100 psi is applied to said piston.

5. The process as defined in claim 3 wherein said off-gas is vented through said piston by means of a vent path that is open during the initial heating step and closed upon movement of said piston.

6. The process as defined in claim 1 wherein the container is located in a microgravity environment.

* * * * *